(12) United States Patent
Shen et al.

(10) Patent No.: US 8,598,630 B2
(45) Date of Patent: Dec. 3, 2013

(54) PHOTO ALIGNMENT MARK FOR A GATE LAST PROCESS

(75) Inventors: Gary Shen, Yonghe (TW); Ming-Yuan Wu, Hsinchu County (TW); Chiung-Han Yeh, Tainan (TW); Kong-Beng Thei, Hsin-Chu Country (TW); Harry Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 803 days.

(21) Appl. No.: 12/470,333

(22) Filed: May 21, 2009

(65) Prior Publication Data

US 2010/0084715 A1 Apr. 8, 2010

Related U.S. Application Data

(60) Provisional application No. 61/103,179, filed on Oct. 6, 2008.

(51) Int. Cl.
*H01L 23/52* (2006.01)
(52) U.S. Cl.
USPC .......................... 257/202; 257/506; 257/797
(58) Field of Classification Search
USPC ............... 257/390, 401, 506, 797, E27.06, 257/E29.02, 798, E23.179, 202, 207; 438/401, 462, 975, FOR. 435, 438/FOR. 495, 199, 283, 587

See application file for complete search history.

(56) References Cited

U.S. PATENT DOCUMENTS

| 5,889,335 | A  | * | 3/1999 | Kuroi et al. | 257/797 |
| 6,100,120 | A  | * | 8/2000 | Yu | 438/151 |
| 6,444,514 | B1 | * | 9/2002 | Nishimoto et al. | 438/221 |
| 6,853,028 | B2 | * | 2/2005 | Kim et al. | 257/315 |
| 7,397,093 | B2 | * | 7/2008 | Sel et al. | 257/390 |
| 2002/0123202 | A1 | * | 9/2002 | Amishiro et al. | 438/382 |
| 2008/0094901 | A1 | * | 4/2008 | Park et al. | 365/185.12 |

OTHER PUBLICATIONS

Taiwanese Patent Office, Office Action dated Oct. 15, 2012, 10121087310, 5 pages.

* cited by examiner

*Primary Examiner* — Olik Chaudhuri
*Assistant Examiner* — Quovaunda V Jefferson
(74) *Attorney, Agent, or Firm* — Haynes and Boone, LLP

(57) ABSTRACT

A semiconductor device is provided which includes a semiconductor substrate having a first region and a second region, the first and second regions being isolated from each other, a plurality of transistors formed in the first region, an alignment mark formed in the second region, the alignment mark having a plurality of active regions in a first direction, and a dummy gate structure formed over the alignment mark, the dummy gate structure having a plurality of lines in a second direction different from the first direction.

20 Claims, 7 Drawing Sheets

PHOTO ALIGNMENT MARK FOR A GATE
LAST PROCESS

PRIORITY DATA

This application claims priority to Provisional Application Ser. No. 61/103,179 filed on Oct. 6, 2008, entitled "Photo Alignment Mark For A Gate Last Process," the entire disclosure of which is incorporated herein by reference.

BACKGROUND

The present disclosure relates generally to forming an integrated circuit device on a substrate and, more particularly, to forming a photo alignment mark in semiconductor fabrication.

Semiconductor device geometries continue to dramatically decrease in size since such devices were first introduced several decades ago. Today's fabrication plants are routinely producing devices having feature dimensions less than 65 nm. However, solving the problems associated with implementing new process and equipment technology while continuing to satisfy device requirements has become more challenging. For example, metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning is completed.

In some IC designs, there has been a desire to replace the polysilicon gate electrode with a metal gate electrode to improve device performance as feature sizes continue to decrease. A gate last process may be implemented to address the concerns of high temperature processing on metal materials. In the gate last process, a dummy poly gate is initially formed and may continue with processing until deposition of an interlayer dielectric (ILD). The dummy poly gate may then be removed and replaced with a metal gate. However, problems arise when integrating the gate last process with other structures and devices typically found in semiconductor fabrication such alignment marks.

SUMMARY

One of the broader forms of an embodiment of the invention involves a semiconductor device. The semiconductor device includes a semiconductor substrate having a first region and a second region, the first and second regions being isolated from each other; a plurality of transistors formed in the first region; an alignment mark formed in the second region, the alignment mark having a plurality of active regions in a first direction; and a dummy gate structure formed over the alignment mark, the dummy gate structure having a plurality of lines in a second direction different from the first direction.

Another one of the broader forms of an embodiment of the invention involves an alignment structure. The alignment structure includes a plurality of active regions formed in a semiconductor substrate in a first direction; an isolation structure formed in the semiconductor substrate, the isolation structure being disposed between adjacent active regions; and a dummy gate structure formed over the plurality of active regions, the dummy gate structure having a plurality of lines in a second direction different from the first direction.

Yet another one of the broader forms of an embodiment of the invention involves a method for fabricating a semiconductor device. The method includes providing a semiconductor substrate having a first region and a second region; forming an alignment mark in the first region, the alignment mark having a plurality of active regions in a first direction and an isolation structure disposed between adjacent active regions; forming a plurality of transistors in the second region including forming a first dummy gate structure for each transistor and a second dummy gate structure over the alignment mark, the second dummy gate structure having a plurality of lines in a second direction different from the first direction; and performing a gate last process to remove the first dummy gate structure of each transistor and replace it with a metal gate.

DETAILED DESCRIPTION

Figure 1A:
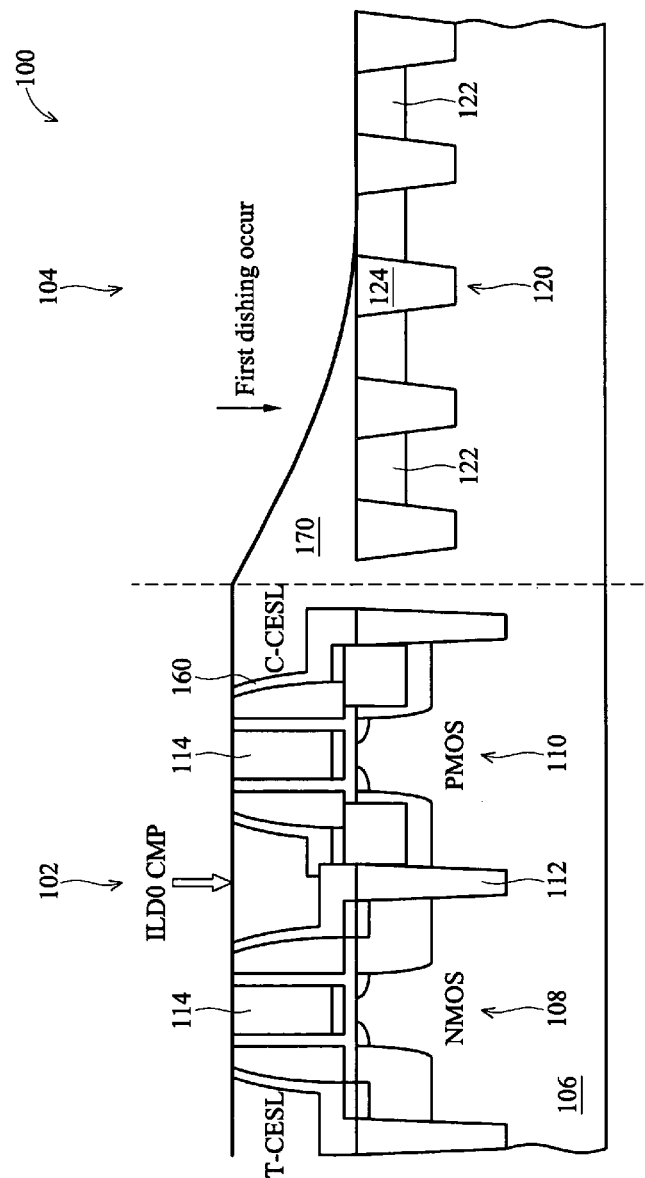
FIGS. 1A and 1B are cross sectional views of a semiconductor device being fabricated in a gate last process, the semiconductor device having a first region with NMOS and PMOS devices formed therein and a second region with an alignment mark formed therein.

The present disclosure relates generally to forming an integrated circuit device on a substrate and, more particularly, to fabricating a decoupling capacitor as part of an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1B:
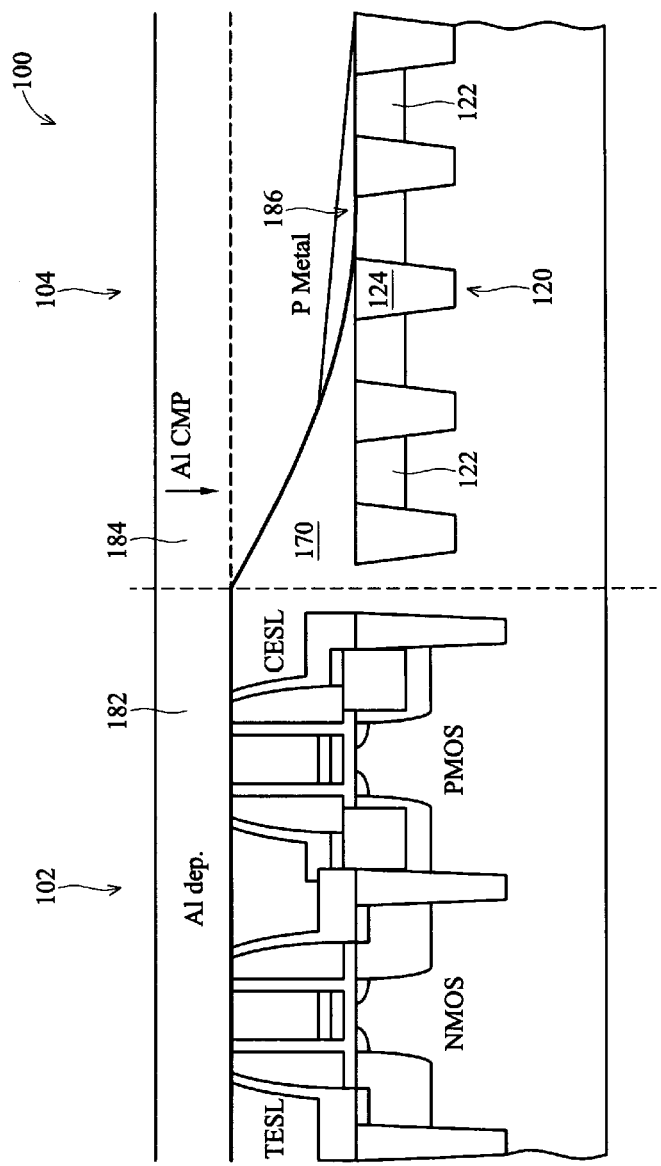

Referring to FIGS. 1A and 1B, illustrated are cross sectional views of a semiconductor device 100 at intermediate stages of fabrication in a gate last process. In the present example, the semiconductor device 100 includes regions 102 and 104 in which various active devices, passive devices, and test structures may be formed as part of fabricating an integrated circuit (IC). For example, the IC may comprise static random access memory (SRAM) and/or other logic circuits, passive components such as resistors, capacitors, and inductors, and active components such as P-channel field effect transistors (pFET), N-channel FET (pFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 100 includes a semiconductor substrate 106 such as a silicon substrate. The substrate 106 may include various doping configurations (n-well or p-well) depending on design requirements as is known in the art. The substrate 106 may also include other elementary semiconductors such as germanium and diamond. Alternatively, the substrate 106 may include a compound semiconductor and/or an alloy semiconductor. Further, the substrate 106 may optionally include an epitaxial layer (epi layer), may be strained for performance enhancement, and may include a silicon-on-insulator (SOI) structure.

The region 102 includes a plurality of transistors such as MOSFETs. The transistors may be configured as N-channel (NMOS) 108 and P-channel (PMOS) 110 as is known in the art. The transistors 108, 110 may be isolated from each other and with other devices by a plurality of isolation structures 112 such as shallow trench isolation (STI) features formed in the substrate. The isolation structures 112 may include silicon oxide, silicon nitride, silicon oxynitride, fluoride-doped silicate glass (FSG), and/or a low k dielectric material.

The transistors 108, 110 each includes a gate dielectric and dummy polysilicon (or poly) gate structure 114. The gate dielectric may include an interfacial layer such as silicon oxide ($SiO_2$) and a high-k dielectric layer such as hafnium oxide ($HfO_2$). Alternatively, the gate dielectric may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The transistors 108, 110 further includes spacers located on both sidewalls of the gate structure. The spacers may be formed of silicon oxide, silicon nitride, silicon oxynitride, fluoride-doped silicate glass (FSG), or a low k dielectric material.

The transistors 108, 110 further includes source/drain (S/D) regions including lightly doped source/drain regions and heavy doped source/drain regions. Also, the PMOS device 110 may include raised S/D regions with SiGe features. The source/drain regions may be formed by implanting p-type or n-type dopants or impurities into the substrate depending on the configuration of the transistors. The transistors 108, 110 further includes silicide features formed on the source/drain regions by a salicide (self-aligned silicide) process to form a contact. The silicide features may include nickel silicide, cobalt silicide, tungsten silicide, tantalum silicide, titanium silicide, platinum silicide, erbium silicide, palladium silicide, or combinations thereof.

The process of forming transistors 108, 110 are performed by a CMOS process flow. For example, the dummy poly gate structures 114 and source/drain structures are formed by methods including thermal oxidation, polysilicon deposition, photolithography, ion implantation, etching, and various other methods known in the art.

Figure 4:
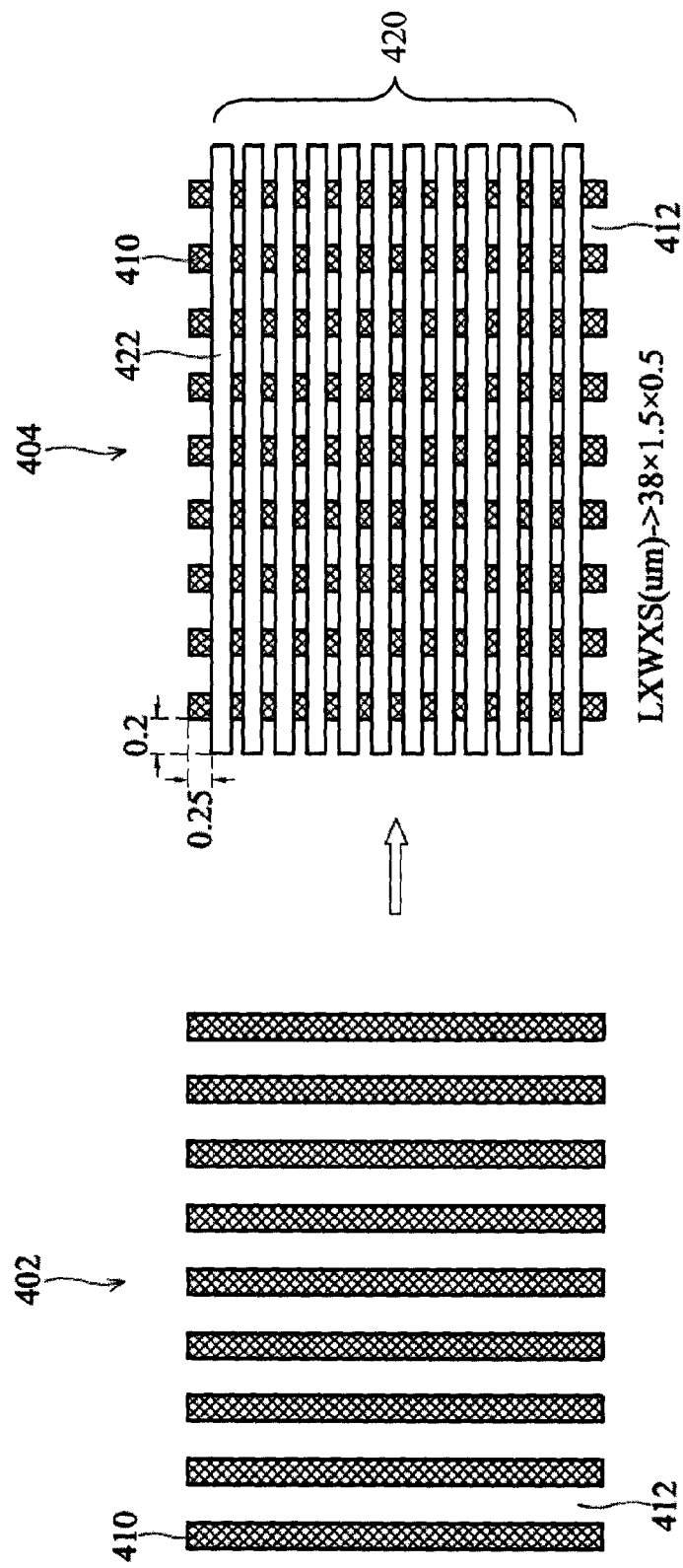
FIG. 4 illustrated are top views of an embodiment of an alignment mark with and without dummy poly gate structures according to various aspects of the present disclosure.
Figure 5:
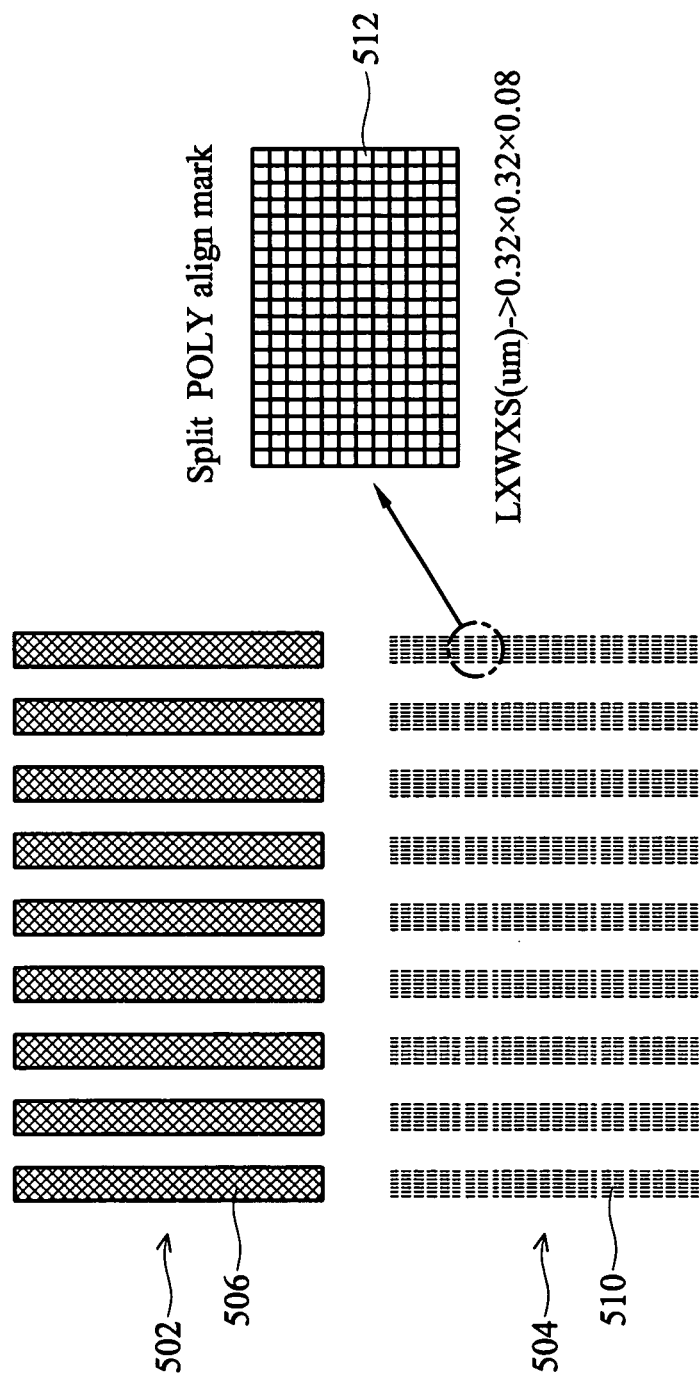
FIG. 5 illustrated are top views of another embodiment of an alignment mark with a split box configuration according to various aspects of the present disclosure.

The region 104 may include an isolated region with a different pattern density as compared to the region 102. That is, region 102 may include more poly gate structures per area than region 104. For example, the region 104 may include an alignment mark 120 for aligning the substrate 106 with a photomask (or reticle) during a photolithography process to pattern various layers of the semiconductor device 200. In the present embodiment, the alignment mark 120 may include a plurality of active regions 122 separated by isolation structures 124. In a top view, the alignment mark 120 may be illustrated as a plurality of parallel lines separated (or spaced apart) by the isolation structures as shown in FIGS. 4 and 5. Although only one alignment mark is illustrated herein it is understood that numerous alignment marks may be implemented at various positions on the substrate 106 to properly align the substrate with a photomask in order to accurately transfer a pattern of the photomask onto the substrate.

After formation of the various microelectronic devices and features in the substrate 106, a stressed layer such as a contact etch stop layer (CESL) may be formed over the transistors 108, 110. The CESL 160 may be formed of silicon nitride, silicon oxynitride, and/or other suitable materials. The CESL 160 composition may be selected based upon etching selectivity to one or more additional features of the semiconductor device 100. Further, the CESL 160 may be configured as a tensile-CESL (T-CESL) or a compressive-CESL (C-CESL) depending on the transistor type.

A dielectric layer 170 such as an inter-level dielectric (ILD) layer 1 may be formed overlying the CESL 160 by chemical vapor deposition (CVD), high density plasma CVD (HDP-CVD), spin-on, sputtering, or other suitable methods. The ILD layer may include silicon oxide, silicon oxynitride, or a low k material. In a gate last process, the dummy poly gate structures 114 of transistors 108, 110 may be removed so that metal gate structures may be formed in place of the dummy poly gate structures. Accordingly, the ILD layer 170 may be planarized by a chemical mechanical polishing (CMP) process 180 (ILD0 CMP process) to expose a top portion of the dummy poly gate structures 114.

However, it has been observed that following the ILD CMP process 180 there may be some over-polishing (or dishing effect) in region 104. The over-polishing or dishing effect may be caused by the different pattern structures and pattern densities in region 102 as compared to region 104. In some situations, the CMP process 180 may even damage and/or remove a portion of the active regions 122 in the substrate the region 104. Accordingly, the alignment mark 120 may degrade and become defective for alignment purposes.

In FIG. 1B, the dummy poly gate structures 114 of transistors 108, 110 are removed by an etching process that selectively etches the polysilicon. The selective removal of the dummy gate structures 114 provides a trench within which a metal gate may be formed. The dummy gate structures 114 may be removed using a wet etch and/or a dry etch. In an embodiment, a wet etch process includes exposure to a hydroxide containing solution (e.g., ammonium hydroxide), deionized water, and/or other suitable etchant solutions. Thereafter, the trenches may be filled with metal materials such as liners, material to provide appropriate work functions (e.g., n-metal and p-metal), fill metal, and other suitable materials to form metal gates. For example, a metal layer 182 such as Al may be formed over the substrate 106 filling in the trenches of the gate structures in region 102. The metal layer may then undergo a CMP process (metal Al CMP process) 184 to remove a portion of the metal layer 182, and form metal gates for the transistors 108, 110 in region 102. However, it has been observed that following the metal Al CMP process there may also be some over-polishing (or dishing effect) on the region 104. Further, there may be some metal residue 186 that remains in the damaged and/or removed portions of the alignment mark 120 in the region 104.

The metal residues 186 can have an adverse effect on subsequent processing such as formation of contacts/vias and various metal layers for interconnecting the various devices and structures of the semiconductor device 100. As previously noted, the alignment mark 120 is used to align the photomask and the substrate during a photolithography process. It is extremely important to properly align the photomask and the substrate in order to transfer the pattern on the photomask onto the substrate at a precise location. This is done for successive material layers that are patterned on the substrate. However, it has been observed that in the region 104 where the alignment mark 120 is located, metal residues 186 may remain proximate to the alignment mark. The metal residues 186 may adversely effect the alignment process when performing the photolithography process. The alignment process may include an alignment system that uses light radiation to align the alignment mark 120 in the region 104 with an alignment mark of the photomask (or reticle). The metal residues 186 can reflect the light radiation such that the alignment process may be defective in generating a sufficient signal for the alignment system to accurately align the photomask with the substrate.

Figure 2:
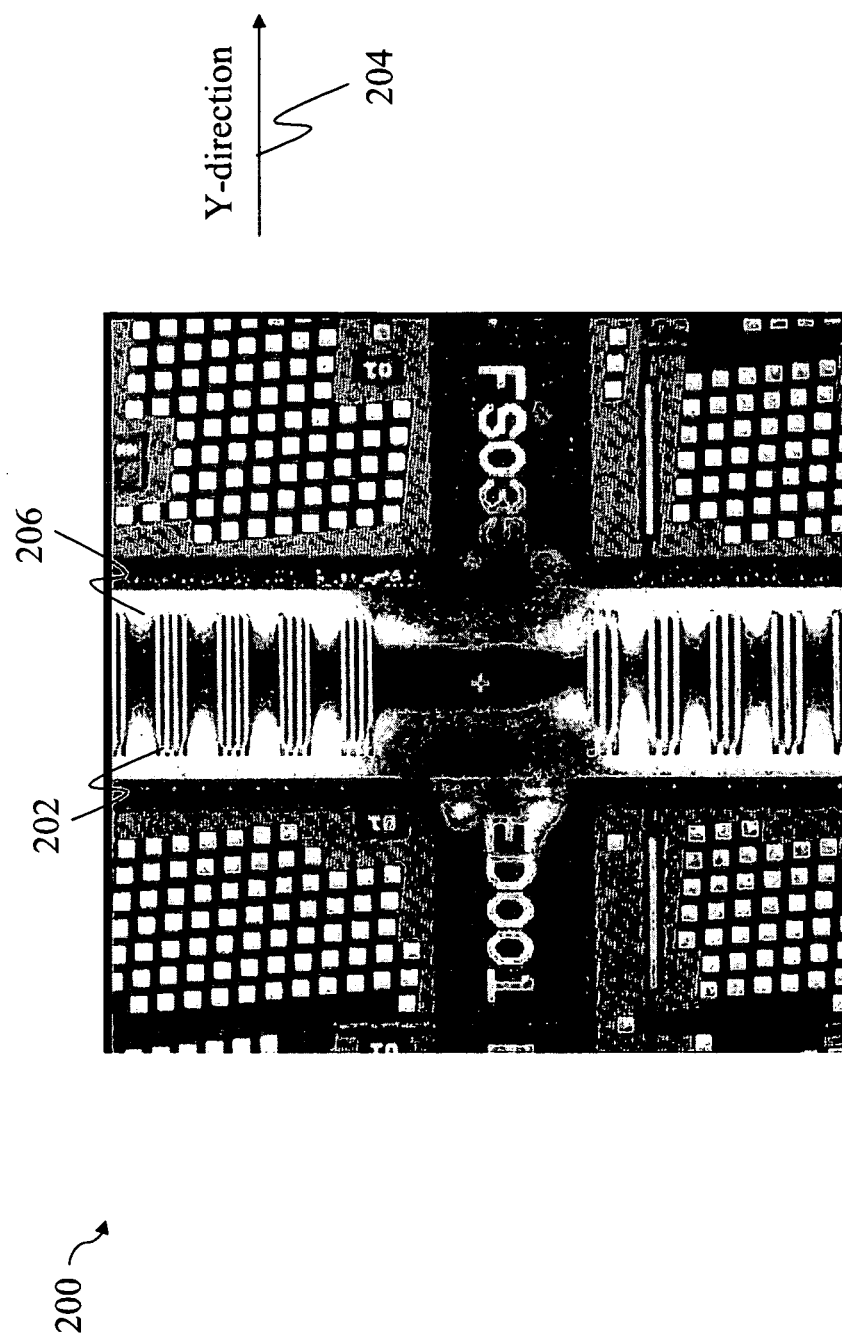
FIG. 2 illustrated is a top view of an alignment mark in a Y-direction showing a problem with metal residues being left behind during a gate last process.

Referring to FIG. 2, illustrated is a top view of an image of a semiconductor substrate 200 having an alignment mark 202 in a Y-direction 204 showing a problem with metal residues 206 left behind from a gate last process. The semiconductor substrate 200 includes a region where a plurality of alignment marks 202 may be located to align the substrate and a photomask in the Y-direction 204. The alignment mark 202 may include a set of parallel lines, each line having a width of about 30 nm (300 angstroms) and spaced about 100 nm (1000 angstroms) apart. It is understood that other widths and spacing may be used for the alignment marks depending on design requirements, semiconductor manufacturing equipment, and process technology. As discussed above, following a CMP process to remove excess metal material in a gate last process, metal residues 206 (e.g., white residues) may remain proximate to the alignment marks 202. Accordingly, an alignment process that uses the alignment marks 202 to pattern a subsequent material layer on the substrate 200 may be defective due to reflections caused by the metal residues 206.

Figure 3:
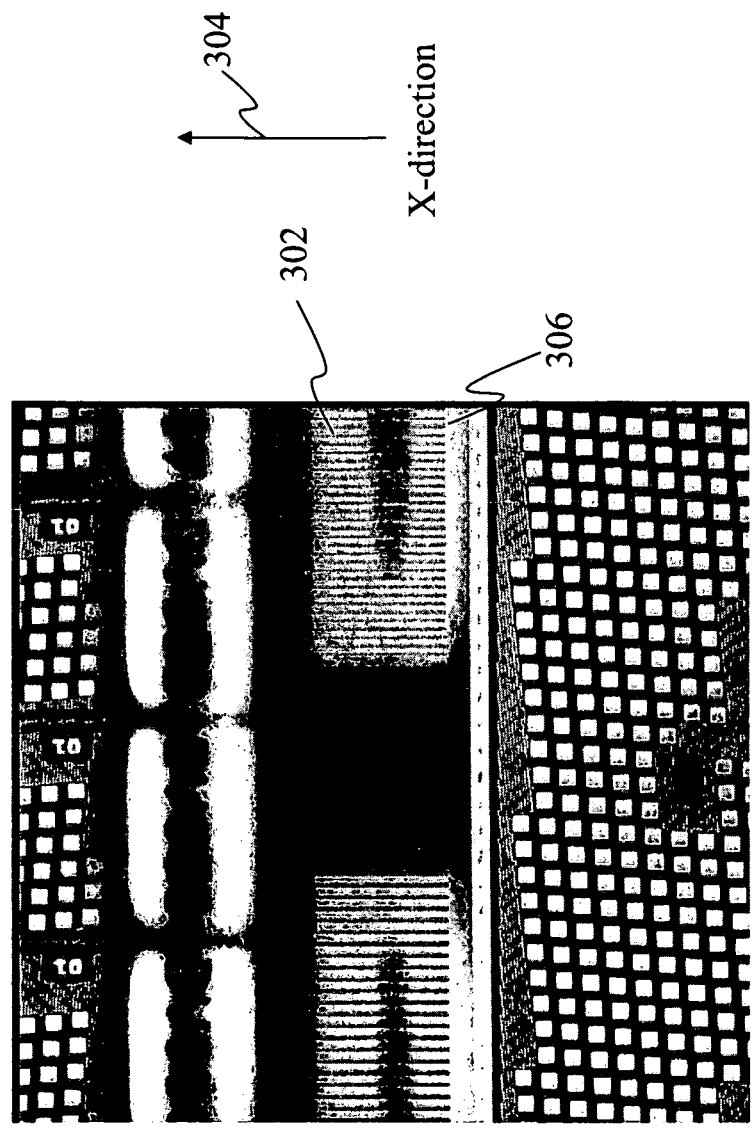
FIG. 3 illustrated is a top view of an alignment mark in an X-direction showing a problem with metal residues being left behind during a gate last process.

Referring to FIG. 3, illustrated is a top view of an image of a semiconductor substrate 300 having an alignment mark 302 in a X-direction 304 showing a problem with metal residues 306 left behind from a gate last process. The semiconductor substrate 300 may include a region where a plurality of alignment marks 302 may be located to align the substrate and a photomask in the X-direction 304. The alignment mark 302 may include sets of parallel lines, each line having a width of about 30 nm (300 angstroms) and spaced about 100 nm (1000 angstroms) apart. It is understood that other widths and spacing may be used for the alignment marks. As discussed above, following a CMP process to remove excess metal material in a gate last process, metal residues 306 (e.g., white residues) may remain proximate to the alignment marks 302. Accordingly, an alignment process that uses the alignment marks 302 to pattern a subsequent material layer on the substrate 300 may be defective due to reflections caused by the metal residues 306.

Referring to FIG. 4, illustrated are top views of an alignment mark 402 without a dummy poly gate structure and an alignment mark 404 with a dummy poly gate structure. The alignment mark 402 may include a plurality of active regions 410 separated by isolation structures 412. The alignment mark 402 may be configured as a set of parallel lines 410 in one direction (e.g., Y-direction or X-direction). As discussed above, the alignment mark 402 may exhibit problems with respect to metal residues in a gate last process. Accordingly, the alignment mark 402 may be improved by splitting the alignment mark with a dummy poly gate structure 420 as illustrated in the alignment mark 404. The alignment mark 404 includes a plurality of active regions 410 separated by isolation structures 412 similar to the alignment mark 402. However, the alignment mark 404 further includes the dummy poly gate structure 420 that covers substantially the entire active region pattern. The dummy poly gate structure 420 may be formed in the same process that forms the dummy poly gate structures 114 of the transistors 108, 110 of FIG. 1A. Thus, no extra masks are required to form the dummy poly gate structure 420.

Figure 4A:
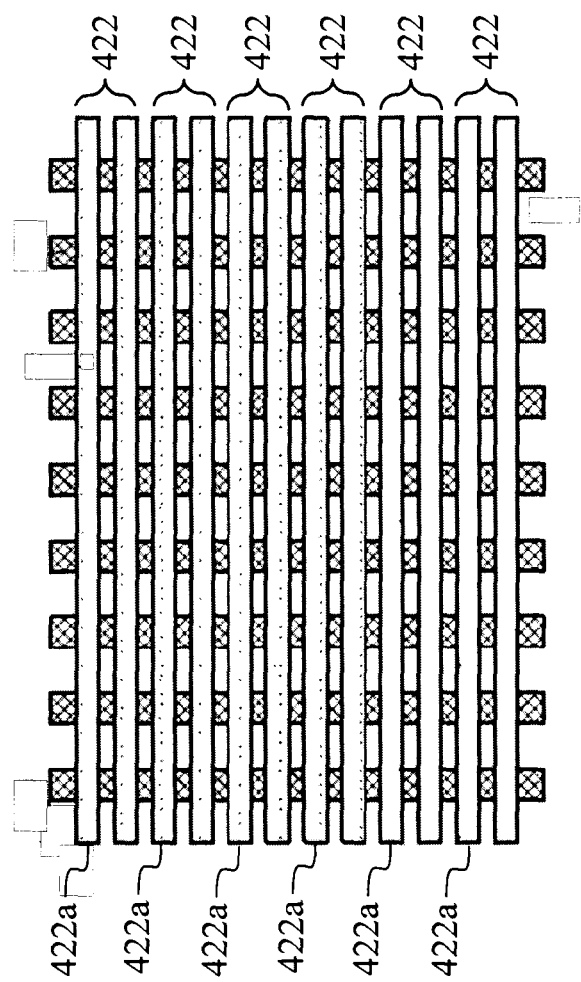
FIG. 4a illustrates a top view of an embodiment of an alignment mark with a dummy poly gate structure according to various aspects of the present disclosure.

The dummy poly gate structure 420 includes a pattern of parallel lines 422 that are in an opposite direction as compared to the lines of the active regions 410. Accordingly, the active regions 410 of the alignment mark 402 and the parallel lines 422 of the dummy poly gate structure 420 form a checker board pattern in a top view. Each line 422 may have a dimension of a length×width×spacing of about 38×1.5×0.5 (um). Further, each line 422 may extend beyond an outer edge of the active region 410 by about 0.2 um, and the active region 410 may extend beyond an outer edge of the line 422 by about 0.25 um. It has been observed that the dummy poly gate structure 420 may function as a polishing stopper and help prevent dishing by the CMP process (e.g., ILD CMP 180 or metal CMP 184 of FIG. 1), and thus no metal residues will remain proximate the alignment mark 404 following metal deposition and metal CMP. It should be noted that the dummy poly gate structure 420 may be protected during the removal of the dummy poly gate structures of the transistors in the other region. Accordingly, an image quality from the alignment process is greatly improved for the photolithography process. It is understood that various patterns may be used for the dummy poly gate structure 420 to improve the image quality. For example, as shown in FIG. 4a, the shape of each line 422 of the dummy poly gate structure 420 may be divided into a number of lines 422a (instead of a single line) spanning across the entire active region pattern.

Referring to FIG. 5, illustrated are top views of an alignment mark 502 without line splitting and an alignment mark 504 with line splitting. The alignment mark 502 may include a plurality of poly gate lines 506 each having a length of about 38 um. The poly gate lines 506 may be formed parallel to each other and in one direction for aligning the substrate and a photomask in that direction. It has been observed that dishing or erosion may occur with the alignment mark 502 in a gate last process as discussed above in FIG. 1. Accordingly, the poly gate lines 506 may be divided into a plurality of squares as shown in the alignment mark 504. The alignment mark 504 may also include a plurality of poly gate lines 510 similar to poly gate lines 506 of the alignment mark 502. However, each of the poly gate lines 510 of alignment mark 504 are further divided or split into a plurality of squares 512. Each square 512 may be have a dimension of a length×width of about 0.32×0.32 (um) and spaced about 0.08 (um) apart. Alternatively, each square 512 may optionally have a dimension of a length×width of about 0.64×0.64 (um). It is understood that other dimensions may be used depending on the size of the poly gate line and a pattern density difference between the regions. The splitting of each poly gate lines 510 may help prevent CMP-induced dishing or erosion and formation of metal residues, and thus better alignment mark qualities may be provided for subsequent processing. Additionally, other shapes instead of squares may be used as well such as circles, ovals, rectangles, or other polygons. It should be noted that the split poly gate structure may be implemented in the alignment mark of FIG. 4.

In summary, alignment marks and methods of making the same are implemented in a gate last process that forms high-k metal gate devices. The gate last process has been observed to be effective in reducing complexity of the front-end-of-the-line (FEOL) process and FEOL defect counts. Also, the gate last process can improve pFET mobility of up to 27%. However, problems have arisen with integrating other structures such as alignment marks with the gate last process. Accordingly, the present disclosure provides a device and method that includes a dummy gate structures that prevents or reduces the risk of damage caused by a CMP process (ILD CMP and metal CMP). The CMP process may cause over-polishing which can degrade and damage alignment marks used to align the substrate with a photomask. It is understood that different embodiments disclosed herein offer different advantages, and that no particular advantage is necessarily required for all embodiments.

The foregoing has outlined features of several embodiments. Those skilled in the art should appreciate that they may readily use the present disclosure as a basis for designing or modifying other processes and structures for carrying out the same purposes and/or achieving the similar advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. Although a gate last process has been described with the embodiments herein, it is understood that the embodiments disclosed herein may be implemented in a hybrid process that includes a gate first process and a gate last process. Further, some processes disclosed herein may be performed concurrently with other processes disclosed herein. For example, the process to form the alignment mark and dummy gate structure overlying the alignment mark may be performed concurrently with the process that forms the transistors.

What is claimed is:

1. A semiconductor device, comprising:
   a semiconductor substrate having a first region and a second region, the first and second regions being isolated from each other;
   a plurality of transistors formed in the first region;
   an alignment mark formed in the second region, the alignment mark having a plurality of active regions extending in a first direction; and
   a dummy gate structure formed over the alignment mark, the dummy poly gate structure having a plurality of lines extending in a second direction different from the first direction, wherein each line in the plurality of lines is divided into a further plurality of spaced parallel lines that each span across every active region in the plurality of active regions in the second direction;
   wherein the plurality of active regions of the alignment mark and the plurality of lines of the dummy gate structure form a checker board pattern when viewed in a third direction perpendicular to the first and second directions.

2. The semiconductor device of claim 1, wherein each transistor includes a high-k gate dielectric and metal gate electrode.

3. The semiconductor device of claim 1, wherein the dummy gate structure is formed of polysilicon.

4. The semiconductor device of claim 1, wherein each line of the further plurality of spaced parallel lines is split into one of squares and rectangles.

5. The semiconductor device of claim 1, wherein the plurality of active regions includes an outermost active region, wherein a portion of each line of the dummy gate structure extends a distance beyond the outermost active region.

6. The semiconductor device of claim 1, wherein the plurality of lines of the dummy gate structure includes an outermost line, wherein a portion of each active region of the alignment mark extends another distance beyond the outermost line.

7. The semiconductor device of claim 1, wherein the first direction is perpendicular to the second direction.

8. An alignment structure, comprising:
   a plurality of active regions formed in a semiconductor substrate, each of the active regions in the plurality of active regions extending in a first direction;
   a plurality of isolation structures formed in the semiconductor substrate, each of the isolation structures in the plurality of isolation structures being disposed between adjacent active regions; and
   a dummy gate structure formed over the plurality of active regions, the dummy gate structure having a plurality of lines extending in a second direction different from the first direction, wherein each line in the plurality of lines physically contacts every active region in the plurality of active regions and each active region in the plurality of active regions physically contacts every line in the plurality of lines, and wherein each line in the plurality of lines is divided into a further plurality of spaced parallel lines that each span across every active region in the plurality of active regions in the second direction.

9. The alignment structure of claim 8, wherein the first direction is perpendicular to the second direction.

10. The alignment structure of claim 8, wherein each line of the further plurality of spaced parallel lines is split into one of squares and rectangles.

11. The alignment structure of claim 8, wherein the plurality of active regions includes an outermost active region, wherein a portion of each line of the dummy gate structure extends a distance beyond the outermost active region.

12. The alignment structure of claim 11, wherein the plurality of lines of the dummy gate structure includes an outermost line, wherein a portion of each active region extends another distance beyond the outermost line.

13. The alignment structure of claim 8, wherein the plurality of active regions and the plurality of lines of the dummy gate structure form a checker board pattern when viewed in a third direction perpendicular to the first and second directions.

14. An alignment structure, comprising:
   a first active region and a second active region formed in a semiconductor substrate, the first and second active regions extending in a first direction;
   an isolation structure disposed in the semiconductor substrate between the first and second active regions and extending in the first direction; and
   a dummy gate structure disposed over the first and second active regions and having a first line and a second line extending in a second direction different from the first direction, the first line physically contacting the first and second active regions and the second line physically contacting the first and second active regions, and wherein the first and second lines are each divided into a plurality of spaced parallel lines that each span across both the first and second active regions in the second direction.

15. The alignment structure of claim 14, wherein the first and second active regions and the first and second lines form a checker board pattern when viewed in a third direction perpendicular to the first and second directions.

16. The alignment structure of claim 14, wherein the first and second active regions are completely separated from each other by the isolation structure.

17. The alignment structure of claim 14, wherein the first active region is an outermost active region of the alignment structure, wherein a portion of the first and second lines extends a distance beyond the outermost active region.

18. The alignment structure of claim 14, wherein the first line is an outermost line of the dummy gate structure, wherein a portion of the first and second active regions extends a distance beyond the outermost line.

19. The alignment structure of claim 14, wherein the first direction is perpendicular to the second direction.

20. The alignment structure of claim 14, wherein the first and second active regions extend a first length in the first direction and a second length in the second direction, the first length being greater than the second length and the second direction being substantially perpendicular to the first direction, and wherein the first and second lines extend a third length in the second direction and a fourth length in the first direction, the third length being greater than the fourth length.

\* \* \* \* \*